(12) United States Patent
Sugiyama et al.

(10) Patent No.: US 11,984,387 B2
(45) Date of Patent: May 14, 2024

(54) PLURALITY OF STACKED TRANSISTORS ATTACHED BY SOLDER BALLS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toru Sugiyama, Musashino (JP); Akira Yoshioka, Yokohama (JP); Yasuhiro Isobe, Ota (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 250 days.

(21) Appl. No.: 17/653,397

(22) Filed: Mar. 3, 2022

(65) Prior Publication Data
US 2023/0081850 A1    Mar. 16, 2023

(30) Foreign Application Priority Data
Sep. 13, 2021   (JP) .................................. 2021-148366

(51) Int. Cl.
*H01L 23/495*    (2006.01)
*H01L 23/00*    (2006.01)
(Continued)

(52) U.S. Cl.
CPC .... *H01L 23/49575* (2013.01); *H01L 23/4952* (2013.01); *H01L 23/49562* (2013.01);
(Continued)

(58) Field of Classification Search
CPC ......... H01L 24/06; H01L 24/13; H01L 24/14; H01L 24/16; H01L 24/17; H01L 23/4952;
(Continued)

(56) References Cited

U.S. PATENT DOCUMENTS 8,987,833 B2    3/2015  McDonald et al.
9,202,811 B2   12/2015  Briere
(Continued)

FOREIGN PATENT DOCUMENTS

JP    2012-222360 A    11/2012
JP    2012-222361 A    11/2012
(Continued)

*Primary Examiner* — Alonzo Chambliss
(74) *Attorney, Agent, or Firm* — Maier & Maier, PLLC

(57) ABSTRACT

A first chip includes a first surface, a second surface, a first semiconductor layer including a nitride semiconductor layer, a first electrode pad located at the first surface, a second electrode pad located at the first surface, a first gate pad located at the first surface, and a third electrode pad located at the first surface. A second chip is located on the first surface of the first chip. The second chip includes a third surface facing the first surface of the first chip, a fourth surface, a second semiconductor layer including a channel of a second conductivity type, a fourth electrode pad located at the fourth surface, a fifth electrode pad located at the third surface and bonded to the second electrode pad of the first chip, and a second gate pad located at the third surface and bonded to the third electrode pad of the first chip.

10 Claims, 13 Drawing Sheets

(51) Int. Cl.
  *H01L 25/065* (2023.01)
  *H01L 25/07* (2006.01)
  *H01L 29/66* (2006.01)
  *H01L 29/778* (2006.01)

(52) U.S. Cl.
  CPC ........ *H01L 23/49568* (2013.01); *H01L 24/14* (2013.01); *H01L 24/17* (2013.01); *H01L 25/0657* (2013.01); *H01L 25/074* (2013.01); *H01L 29/66431* (2013.01); *H01L 29/66462* (2013.01); *H01L 29/778* (2013.01); *H01L 2924/1033* (2013.01); *H01L 2924/13064* (2013.01); *H01L 2924/13091* (2013.01)

(58) Field of Classification Search
  CPC ......... H01L 23/49562; H01L 23/49568; H01L 25/074; H01L 25/0657; H01L 2924/13091; H01L 2924/13064; H01L 2924/1033; H01L 29/66462; H01L 29/66431; H01L 29/778
  See application file for complete search history.

(56) References Cited

U.S. PATENT DOCUMENTS

| | | | |
|---|---|---|---|
| 9,343,440 B2 | 5/2016 | McDonald et al. | |
| 9,362,267 B2 | 6/2016 | Briere et al. | |
| 11,594,476 B2* | 2/2023 | Ohguro | H01L 24/92 |
| 11,791,245 B2* | 10/2023 | Yen | H01L 24/82 |
| | | | 257/676 |
| 2007/0262346 A1* | 11/2007 | Otremba | H01L 23/481 |
| | | | 257/777 |
| 2009/0283919 A1* | 11/2009 | Tsui | H01L 24/41 |
| | | | 257/E23.141 |
| 2012/0280308 A1* | 11/2012 | Disney | H01L 23/49575 |
| | | | 257/329 |
| 2013/0049137 A1* | 2/2013 | Uno | H01L 24/40 |
| | | | 257/E27.06 |
| 2013/0321082 A1* | 12/2013 | Yamada | H01L 29/7783 |
| | | | 257/77 |
| 2014/0061884 A1* | 3/2014 | Carpenter | H01L 23/49575 |
| | | | 257/676 |

FOREIGN PATENT DOCUMENTS

| | | |
|---|---|---|
| JP | 2013-206942 A | 10/2013 |
| JP | 2013-211548 A | 10/2013 |
| JP | 2013-222905 A | 10/2013 |
| JP | 2014-131027 A | 7/2014 |
| JP | 2019-91783 A | 6/2019 |

\* cited by examiner

US 11,984,387 B2

PLURALITY OF STACKED TRANSISTORS ATTACHED BY SOLDER BALLS

CROSS-REFERENCE TO RELATED APPLICATION

This application is based upon and claims the benefit of priority from Japanese Patent Application No. 2021-148366, filed on Sep. 13, 2021; the entire contents of which are incorporated herein by reference.

FIELD

Embodiments described herein relate generally to a semiconductor device.

BACKGROUND

Generally, it is desirable for a power device to be in the off-state (normally-off) when no input signal is applied to the gate. Due to its structure, a HEMT (High Electron Mobility Transistor) that uses, for example, gallium nitride (GaN) has the characteristic of being in the on-state (normally-on) when no input signal is applied to the gate. Therefore, a power device has been proposed in which a GaN HEMT and a normally-off silicon MOSFET (Metal-Oxide-Semiconductor Field Effect Transistor) have a cascode connection and are combined in a package.

DETAILED DESCRIPTION

Figure 1:
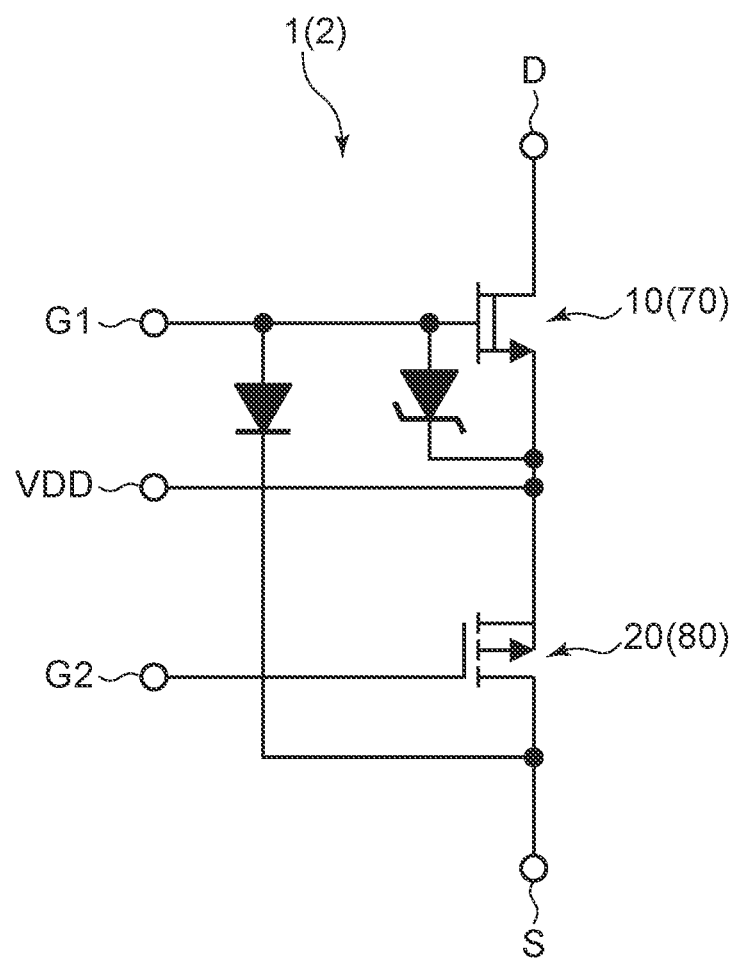
FIG. 1 is an equivalent circuit diagram of semiconductor devices of a first embodiment and a second embodiment.

According to one embodiment, a semiconductor device includes a first chip of a first type, and a second chip of a second type that is different from the first type. The first chip includes a first surface, a second surface at a side opposite to the first surface, a first semiconductor layer including a nitride semiconductor layer of a first conductivity type, a first electrode pad located at the first surface, a second electrode pad located at the first surface, a first gate pad located at the first surface, and a third electrode pad located at the first surface. The second chip is located on the first surface of the first chip. The second chip includes a third surface facing the first surface of the first chip, a fourth surface at a side opposite to the third surface, a second semiconductor layer including a channel of a second conductivity type, a fourth electrode pad located at the fourth surface, a fifth electrode pad located at the third surface and bonded to the second electrode pad of the first chip, and a second gate pad located at the third surface and bonded to the third electrode pad of the first chip.

Embodiments will now be described with reference to the drawings. The same configurations are marked with the same reference numerals in the drawings. Although the first conductivity type is described as an n-type and the second conductivity type is described as a p-type in the following description, the first conductivity type may be the p-type, and the second conductivity type may be the n-type.

First Embodiment

A semiconductor device 1 of a first embodiment will now be described with reference to FIGS. 1 to 5.

Figure 2:
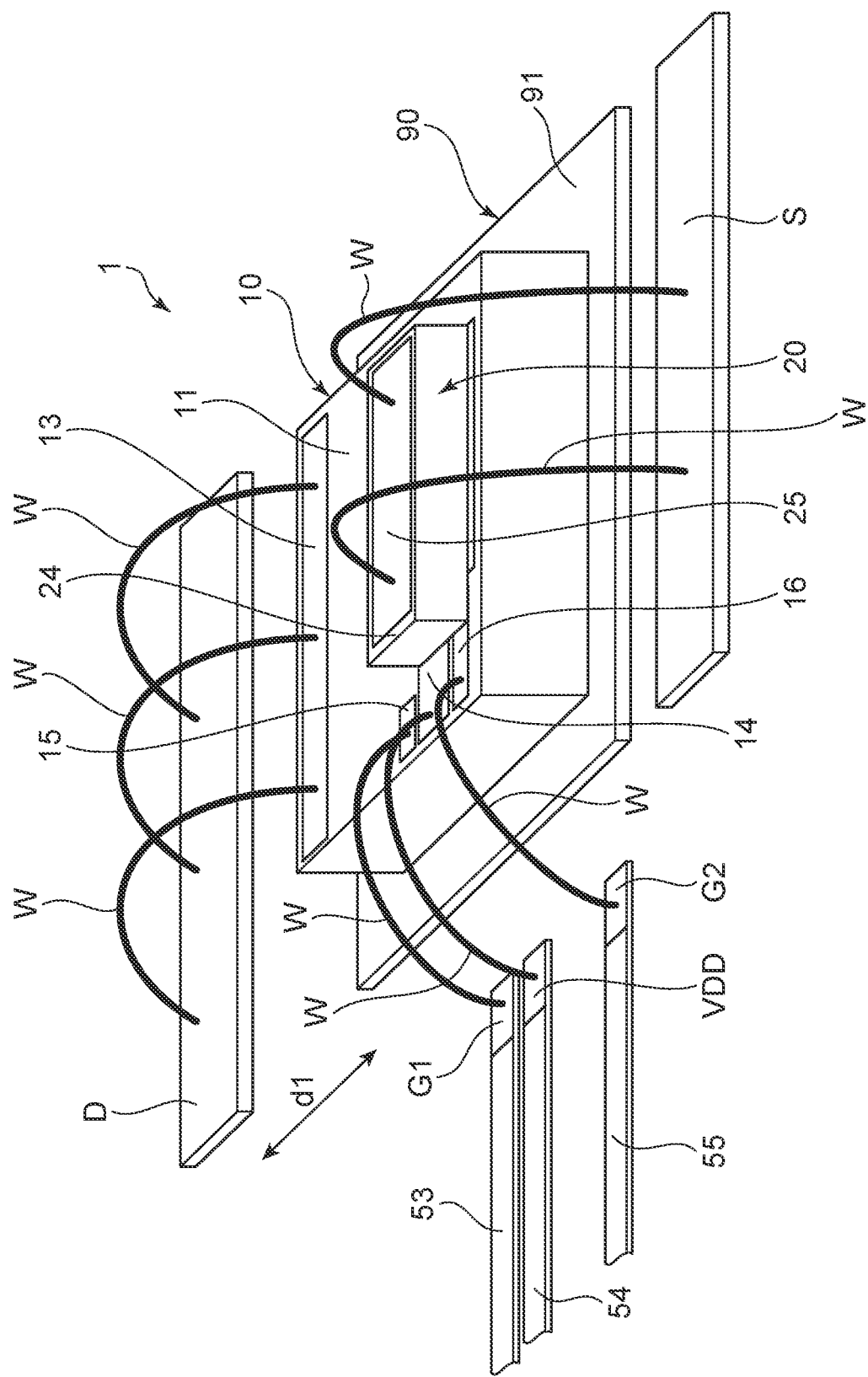
FIG. 2 is a schematic perspective view of the semiconductor device of the first embodiment.

As shown in FIG. 2, the semiconductor device 1 includes a first chip 10, a second chip 20, and a leadframe 90. The leadframe 90 is a metal member that includes a die pad 91, a drain terminal D, a source terminal S, a first gate terminal G1, a second gate terminal G2, and a power supply terminal VDD. The first chip 10 is mounted on the die pad 91. The second chip 20 is mounted on the first chip 10. As shown in FIG. 1, the first chip 10 and the second chip 20 have a cascode connection between the drain terminal D and the source terminal S.

Figure 5:
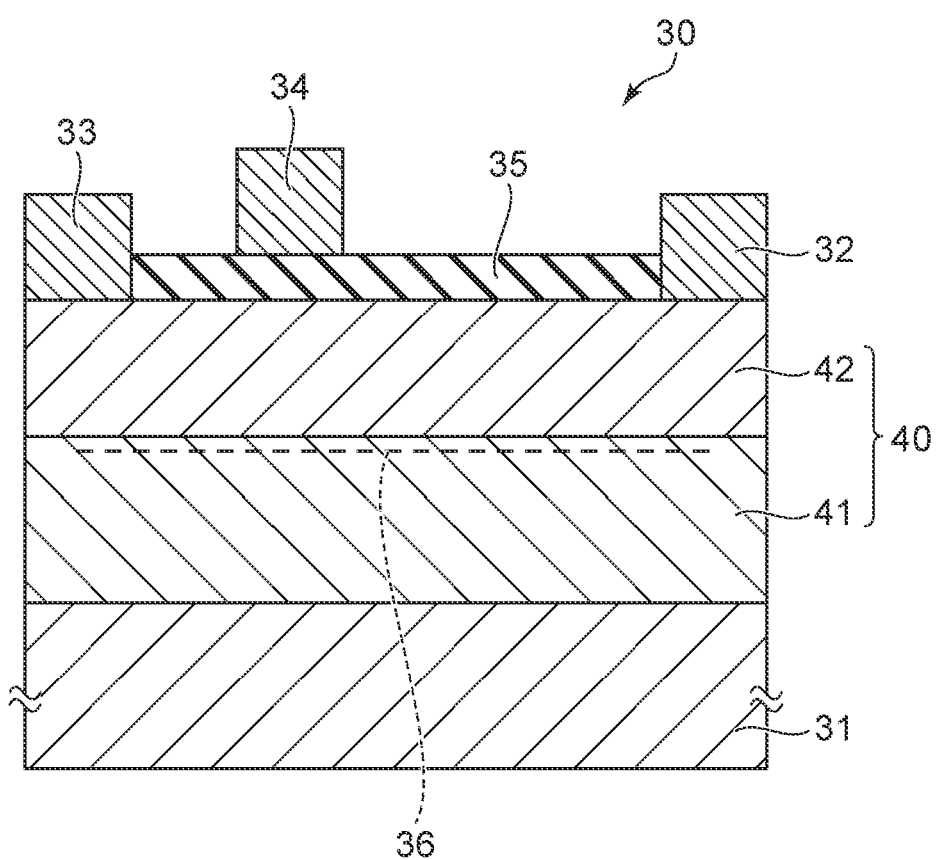
FIG. 5 is a schematic cross-sectional view showing an example of a HEMT.

The first chip 10 includes, for example, a normally-on (a first-type) HEMT that is on when no input signal is applied to the gate. FIG. 5 is a schematic cross-sectional view showing an example of an element part 30 of the first chip 10 that includes the HEMT.

The first chip 10 includes a first semiconductor layer 40. The first semiconductor layer 40 has a heterojunction structure of a first nitride semiconductor layer 41 and a second nitride semiconductor layer 42. The first nitride semiconductor layer 41 is located on a substrate 31; and the second nitride semiconductor layer 42 is located on the first nitride semiconductor layer 41. The second nitride semiconductor layer 42 has a larger bandgap than the first nitride semiconductor layer 41. For example, the first nitride semiconductor layer 41 is an undoped GaN layer; and the second nitride semiconductor layer 42 is an AlGaN layer. A two-dimensional electron gas 36 is formed in the first nitride semiconductor layer 41 at the vicinity of the interface with the second nitride semiconductor layer 42.

A drain electrode 32 and a source electrode 33 are located on the second nitride semiconductor layer 42. The drain electrode 32 and the source electrode 33 contact the second nitride semiconductor layer 42. A gate electrode 34 is located on the second nitride semiconductor layer 42 at a region between the drain electrode 32 and the source electrode 33 with an insulating film 35 interposed.

Figure 3:
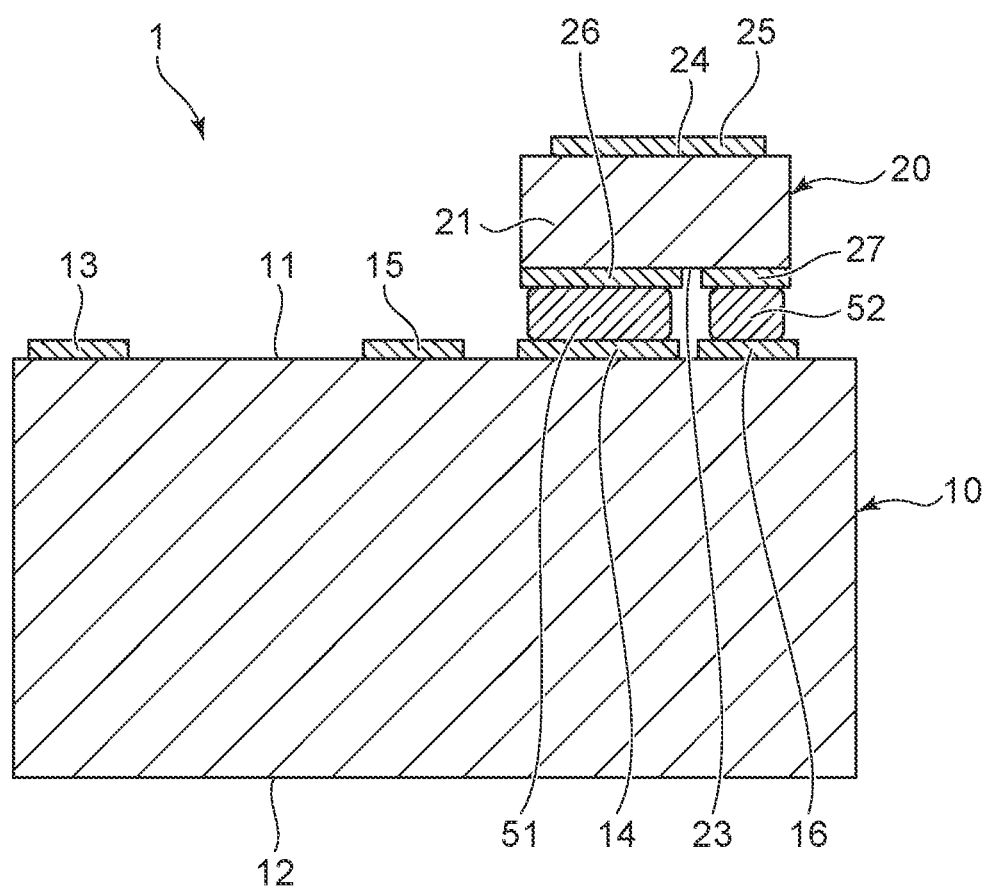
FIG. 3 is a schematic cross-sectional view of the semiconductor device of the first embodiment.
Figure 4:
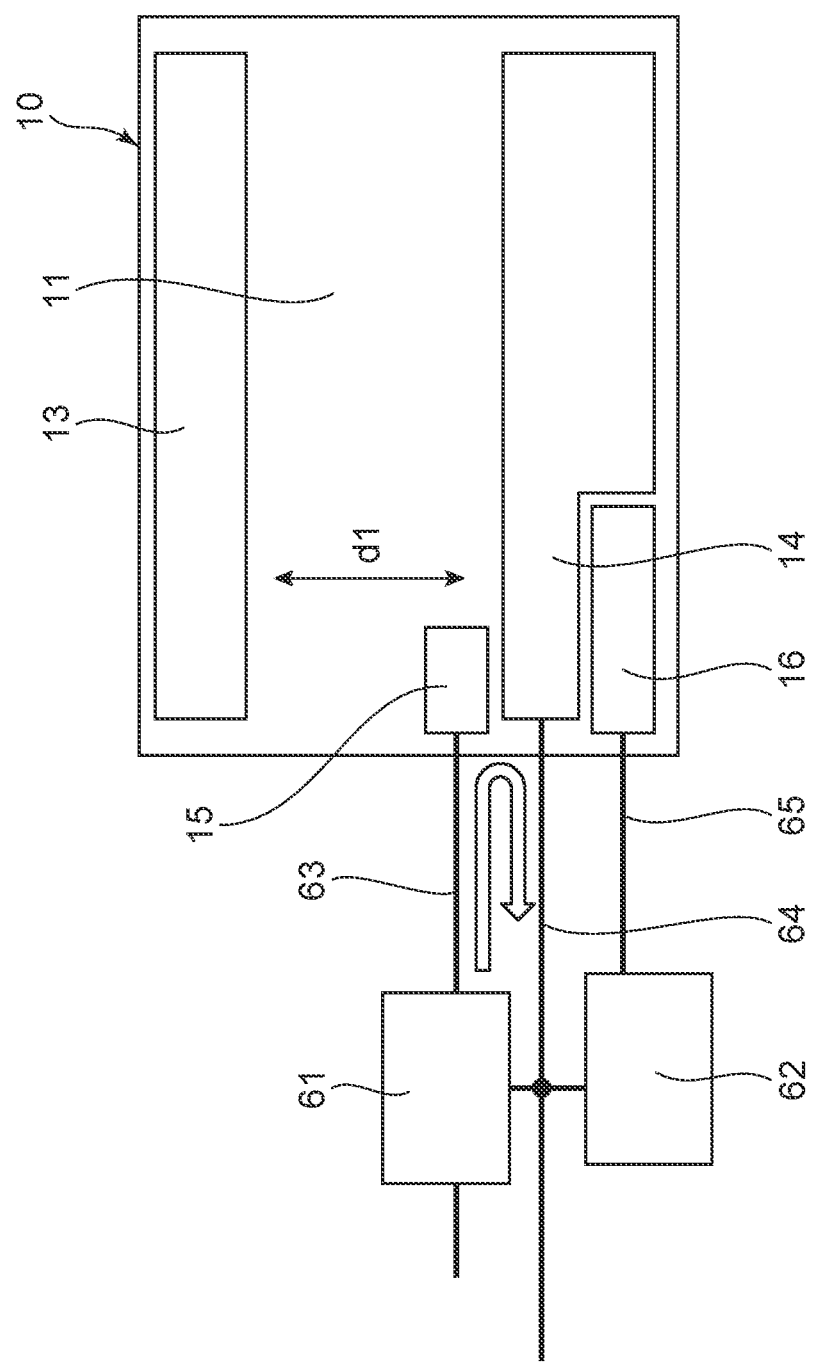
FIG. 4 is a schematic plan view of the semiconductor device of the first embodiment.

As shown in FIGS. 2 to 4, the first chip 10 includes a first surface 11, a second surface 12 at the side opposite to the first surface 11, a first electrode pad 13, a second electrode pad 14, a first gate pad 15, and a third electrode pad 16. The first electrode pad 13, the second electrode pad 14, the first gate pad 15, and the third electrode pad 16 are located in the first surface 11.

The second surface 12 is, for example, the back surface of the substrate 31 of the element part 30 shown in FIG. 5. An insulating film that covers the drain electrode 32, the source electrode 33, and the gate electrode 34 is located on the second nitride semiconductor layer 42 of the element part 30; and the first electrode pad 13, the second electrode pad 14, the first gate pad 15, and the third electrode pad 16 are located on the insulating film.

The first electrode pad 13 is a drain pad that is electrically connected to the drain electrode 32. The second electrode pad 14 is a source pad that is electrically connected to the source electrode 33. The first gate pad 15 is electrically connected to the gate electrode 34. The third electrode pad 16 is not electrically connected to any of the drain electrode 32, the source electrode 33, and the gate electrode 34.

As shown in FIG. 2, the first chip 10 is mounted on the die pad 91 of the leadframe 90. The second surface 12 of the first chip 10 is bonded to the upper surface of the die pad 91.

The first electrode pad 13 is electrically connected to the drain terminal D by a wire W. The second electrode pad 14 is electrically connected to the power supply terminal VDD by a wire W. The first gate pad 15 is electrically connected to the first gate terminal G1 by a wire W. The third electrode pad 16 is electrically connected to the second gate terminal G2 by a wire W.

The second chip 20 is normally-off (a second type) that is off when no input signal is applied to the gate and includes, for example, a p-channel MOSFET. As shown in FIGS. 2 and 3, the second chip 20 is mounted on the first surface 11 of the first chip 10.

The second chip 20 includes a third surface 23 facing the first surface 11 of the first chip 10, a fourth surface 24 at the side opposite to the third surface 23, a second semiconductor layer 21, a fourth electrode pad (a drain pad) 25 located at the fourth surface 24, a fifth electrode pad (a source pad) 26 located at the third surface 23, and a second gate pad 27 located at the third surface 23. The surface area of the first surface 11 of the first chip 10 is greater than the surface area of the third surface 23 of the second chip 20.

The second semiconductor layer 21 is, for example, a silicon layer and includes a p-type channel. The second chip 20 is a vertical device in which a current flows in the thickness direction of the second semiconductor layer 21 (the vertical direction connecting the fourth electrode pad 25 and the fifth electrode pad 26). The fourth electrode pad 25 functions as the drain electrode of the MOSFET. The fifth electrode pad 26 functions as the source electrode of the MOSFET. The second gate pad 27 is electrically connected to the gate electrode of the MOSFET.

As shown in FIG. 3, the fifth electrode pad (the source pad) 26 of the second chip 20 faces the second electrode pad (the source pad) 14 of the first chip 10. For example, an electrically conductive bump (or bonding material) 51 such as solder or the like is located between the fifth electrode pad 26 of the second chip 20 and the second electrode pad 14 of the first chip 10. The fifth electrode pad 26 of the second chip 20 is bonded to the second electrode pad 14 of the first chip 10 via the electrically conductive bump 51 and is electrically connected to the second electrode pad 14. In other words, the source electrodes of the first and second chips 10 and 20 are electrically connected to each other.

The second gate pad 27 of the second chip 20 faces the third electrode pad 16 of the first chip 10. For example, an electrically conductive bump (or bonding material) 52 such as solder or the like is located between the second gate pad 27 of the second chip 20 and the third electrode pad 16 of the first chip 10. The second gate pad 27 of the second chip 20 is bonded to the third electrode pad 16 of the first chip 10 via the electrically conductive bump 52 and is electrically connected to the third electrode pad 16. In other words, the gate electrode of the MOSFET of the second chip 20 is electrically connected to the third electrode pad 16 located on the first surface 11 of the first chip 10.

As shown in FIG. 2, the fourth electrode pad (the drain pad) 25 of the second chip 20 is electrically connected to the source terminal S by a wire W.

The leadframe 90 to which the first chip 10 and the second chip 20 are mounted is mounted on a wiring substrate. The first chip 10, the second chip 20, and the leadframe 90 are packaged by being covered with a resin. Wiring layers 53, 54, and 55 of FIG. 2 show wiring layers included in the wiring substrate. The wiring layer 53 is electrically connected to the first gate terminal G1. The wiring layer 54 is electrically connected to the power supply terminal VDD. The wiring layer 55 is electrically connected to the second gate terminal G2.

As shown in FIG. 4, the first gate pad 15 of the first chip 10 is electrically connected to a gate driver 61 by wiring 63. The wiring 63 includes the wire W, the first gate terminal G1, and the wiring layer 53 shown in FIG. 2, etc.

A voltage VDD is applied via wiring 64 to the second electrode pad 14 that is electrically connected to the source electrode of the first chip 10 and the source electrode of the second chip 20. The wiring 64 includes the wire W, the power supply terminal VDD, and the wiring layer 54 shown in FIG. 2, etc.

The third electrode pad 16 that is electrically connected to the second gate pad 27 of the second chip 20 is electrically connected to a second chip drive circuit 62 by wiring 65. The wiring 65 includes the wire W, the second gate terminal G2, and the wiring layer 55 shown in FIG. 2, etc.

According to the semiconductor device 1 of the first embodiment, the region in the package where the first chip 10 can be mounted is increased by mounting the second chip 20 on the first chip 10. The chip size of the first chip 10 can be increased thereby, and the on-resistance can be reduced.

The second electrode pad (the source pad) 14 of the first chip 10 and the fifth electrode pad (the source pad) 26 of the second chip 20 are connected by the electrically conductive bump 51 without using a wire. The parasitic inductance of the connection portion between the source electrodes of the first and second chips 10 and 20 can be reduced thereby, and ringing of the power current loop can be reduced.

When bonding the fifth electrode pad 26 of the second chip 20 to the second electrode pad 14 of the first chip 10, the third surface 23 of the second chip 20 at which the fifth electrode pad 26 is located faces the first surface 11 of the first chip 10 at which the second electrode pad 14 is located. The second gate pad 27 also is located at the third surface 23 of the second chip 20. According to the first embodiment, the third electrode pad 16 that is not electrically connected to the electrodes of the first chip 10 is located at the first surface 11 of the first chip 10; and the second gate pad 27 of the second chip 20 is bonded to the third electrode pad 16. Thereby, the gate electrode of the second chip 20 can be electrically connected to an external circuit via a wire W or the like that is connected to the third electrode pad 16.

The second chip 20 that includes the p-channel MOSFET can have an ideal Kelvin connection in the cascode connection with the first chip 10. In other words, the connection portion (the second electrode pad 14 and the power supply terminal VDD) of the source electrodes of the first and second chips 10 and 20 functions as a driver source terminal connected to the return line of the gate current loop of the first chip 10 (illustrated by a white thick arrow in FIG. 4). Thereby, compared to a configuration in which an n-channel MOSFET has a cascode connection with the first chip 10, the gate current loop can be shorter, and the ringing can be reduced by the reduction of the parasitic inductance of the gate current loop.

As shown in FIG. 4, the second electrode pad 14 is positioned between the first gate pad 15 and the third electrode pad 16 in a first direction d1 parallel to the first surface 11. As shown in FIG. 2, the power supply terminal VDD that is electrically connected to the second electrode pad 14 is positioned between the first gate terminal G1 electrically connected to the first gate pad 15 and the second gate terminal G2 electrically connected to the third electrode pad 16 in the first direction d1. Thereby, as shown in FIG. 4, the wiring 63 and the wiring 64 that form the gate current loop can be proximate and parallel along a direction crossing the first direction d1; and the noise of the gate signal can be reduced.

Second Embodiment

A semiconductor device 2 of a second embodiment will now be described with reference to FIGS. 6 to 8. According to the second embodiment, the same configurations as the first embodiment are marked with the same reference numerals; and a description may be omitted.

Figure 6:
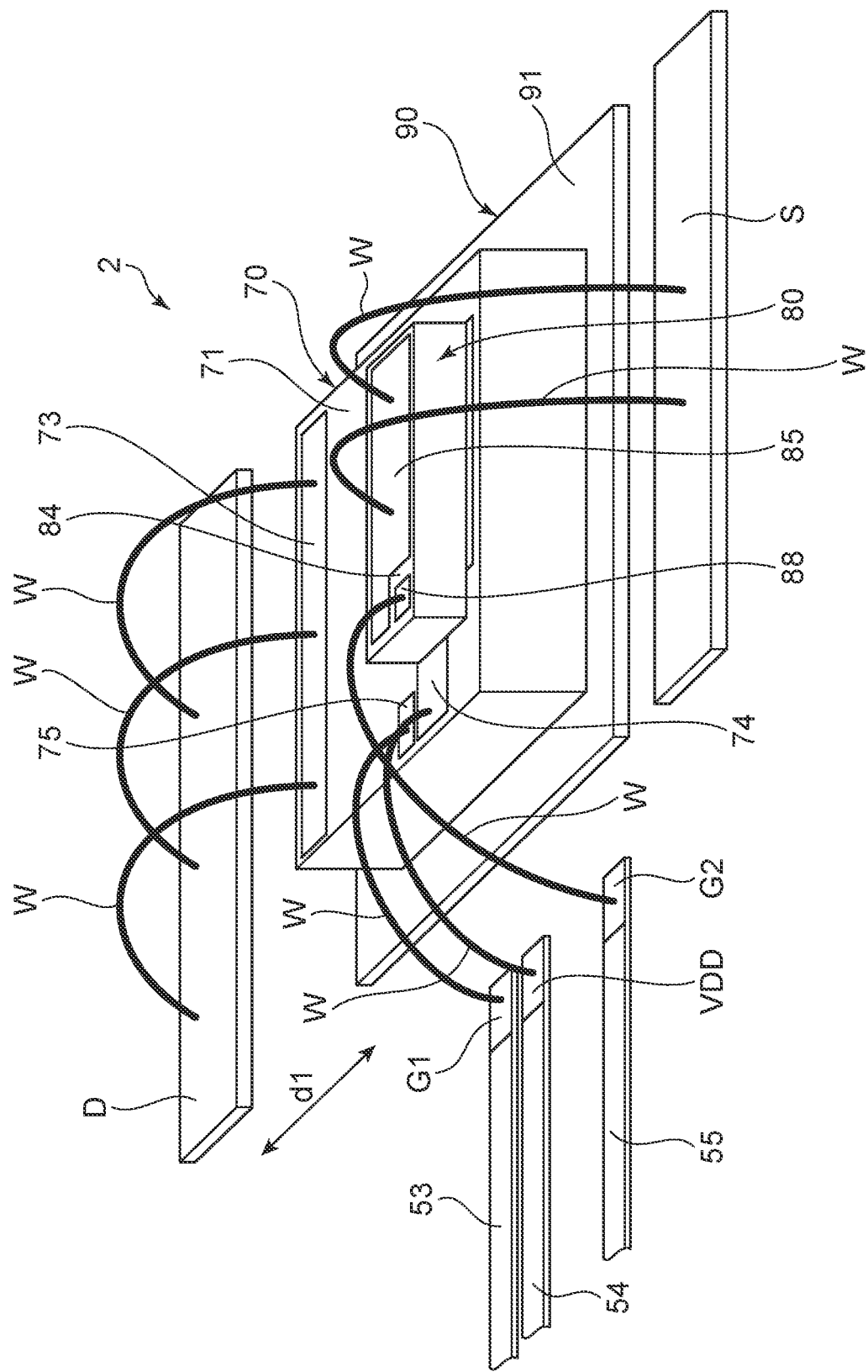
FIG. 6 is a schematic perspective view of the semiconductor device of the second embodiment.
Figure 7:
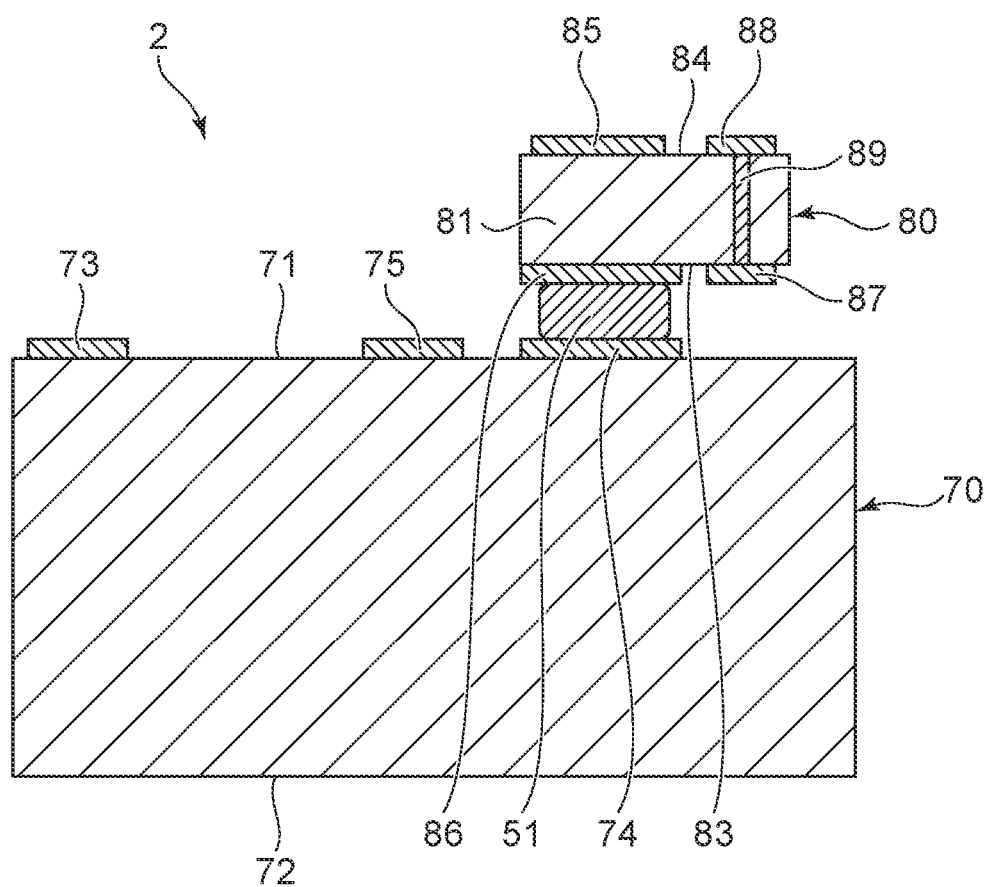
FIG. 7 is a schematic cross-sectional view of the semiconductor device of the second embodiment.

As shown in FIG. 6, the semiconductor device 2 includes a first chip 70, a second chip 80, and the leadframe 90. The first chip 70 is mounted on the die pad 91 of the leadframe 90. The second chip 80 is mounted on the first chip 70. Similarly to the first embodiment as shown in FIG. 1, the first chip 70 and the second chip 80 have a cascode connection between the drain terminal D and the source terminal S.

The first chip 70 includes, for example, a normally-on HEMT that is on when no input signal is applied to the gate. Similarly to the first chip 10 of the first embodiment, the first chip 70 can include the element part 30 shown in FIG. 5.

The first chip 70 includes a first surface 71, a second surface 72 at the side opposite to the first surface 71, a first electrode pad 73, a second electrode pad 74, and a first gate pad 75. The first electrode pad 73, the second electrode pad 74, and the first gate pad 75 are located at the first surface 71.

The second surface 72 is, for example, the back surface of the substrate 31 of the element part 30 shown in FIG. 5. An insulating film that covers the drain electrode 32, the source electrode 33, and the gate electrode 34 is located on the second nitride semiconductor layer 42 of the element part 30; and the first electrode pad 73, the second electrode pad 74, and the first gate pad 75 are located on the insulating film.

The first electrode pad 73 is a drain pad that is electrically connected to the drain electrode 32. The second electrode pad 74 is a source pad that is electrically connected to the source electrode 33. The first gate pad 75 is electrically connected to the gate electrode 34.

As shown in FIG. 6, the first chip 70 is mounted on the die pad 91 of the leadframe 90. The second surface 72 of the first chip 70 is bonded to the upper surface of the die pad 91. The first electrode pad 73 is electrically connected to the drain terminal D by a wire W. The second electrode pad 74 is electrically connected to the power supply terminal VDD by a wire W. The first gate pad 75 is electrically connected to the first gate terminal G1 by a wire W.

The second chip 80 is normally-off, i.e., off when no input signal is applied to the gate, and includes, for example, a p-channel MOSFET. As shown in FIGS. 6 and 7, the second chip 80 is mounted on the first surface 71 of the first chip 70.

The second chip 80 includes a third surface 83 facing the first surface 71 of the first chip 70, and a fourth surface 84 at the side opposite to the third surface 83. The surface area of the first surface 71 of the first chip 70 is greater than the surface area of the third surface 83 of the second chip 80. The second chip 80 also includes a second semiconductor layer 81, a third electrode pad (a source pad) 86, a second gate pad 87, a fourth electrode pad (a drain pad) 85, a third gate pad 88, and a connection member 89.

The third electrode pad (the source pad) 86 and the second gate pad 87 are located at the third surface 83. The fourth electrode pad (the drain pad) 85 and the third gate pad 88 are located at the fourth surface 84. The connection member 89 is an electrically conductive member located in a through-hole that extends between the third surface 83 and the fourth surface 84. The connection member 89 extends between the third surface 83 and the fourth surface 84 and electrically connects the second gate pad 87 and the third gate pad 88.

The second semiconductor layer 81 is, for example, a silicon layer and includes a p-type channel. The second chip 80 is a vertical device in which a current flows in the thickness direction of the second semiconductor layer 81 (the vertical direction connecting the fourth electrode pad 85 and the third electrode pad 86). The fourth electrode pad 85 functions as the drain electrode of the MOSFET. The third electrode pad 86 functions as the source electrode of the MOSFET. The second gate pad 87 is electrically connected to the gate electrode of the MOSFET.

The third electrode pad (the source pad) 86 of the second chip 80 faces the second electrode pad (the source pad) 74 of the first chip 70. For example, the electrically conductive bump (or bonding material) 51 such as solder or the like is located between the third electrode pad 86 of the second chip 80 and the second electrode pad 74 of the first chip 70. The third electrode pad 86 of the second chip 80 is bonded to the second electrode pad 74 of the first chip 70 via the electrically conductive bump 51 and is electrically connected to the second electrode pad 74. In other words, the source electrodes of the first and second chips 70 and 80 are electrically connected to each other.

As shown in FIG. 6, the fourth electrode pad (the drain pad) 85 of the second chip 80 is electrically connected to the source terminal S by a wire W. The third gate pad 88 of the second chip 80 is electrically connected to the second gate terminal G2 by a wire W. In other words, the gate electrode of the MOSFET of the second chip 80 is electrically connected to the second gate terminal G2 via the second gate pad 87, the connection member 89, the third gate pad 88, and the wires W.

The leadframe 90 to which the first chip 70 and the second chip 80 are mounted is mounted on a wiring substrate. The first chip 70, the second chip 80, and the leadframe 90 are packaged by being covered with a resin. The wiring layers 53, 54, and 55 of FIG. 6 show wiring layers included in the wiring substrate. The wiring layer 53 is electrically connected to the first gate terminal G1. The wiring layer 54 is electrically connected to the power supply terminal VDD. The wiring layer 55 is electrically connected to the second gate terminal G2.

Figure 8:
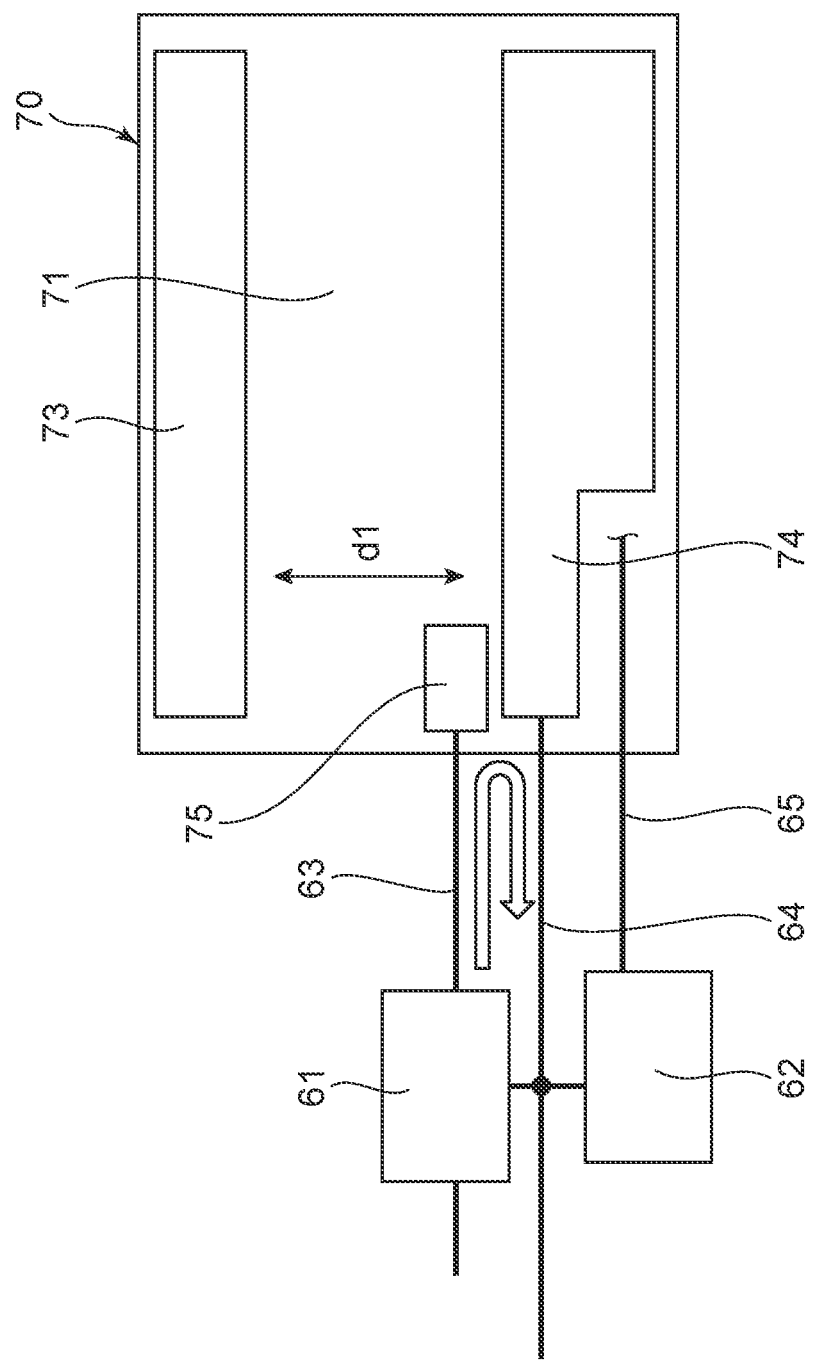
FIG. 8 is a schematic plan view of the semiconductor device of the second embodiment.

As shown in FIG. 8, the first gate pad 75 of the first chip 70 is electrically connected to the gate driver 61 by the wiring 63. The wiring 63 includes the wire W, the first gate terminal G1, and the wiring layer 53 shown in FIG. 6, etc.

The voltage VDD is applied via the wiring 64 to the second electrode pad 74 that is electrically connected to the source electrode of the first chip 70 and to the source electrode of the second chip 80. The wiring 64 includes the wire W, the power supply terminal VDD, and the wiring layer 54 shown in FIG. 6, etc.

The third gate pad 88 of the second chip 80 is electrically connected to the second chip drive circuit 62 by the wiring 65. The wiring 65 includes the wire W, the second gate terminal G2, and the wiring layer 55 shown in FIG. 6, etc.

According to the semiconductor device 2 of the second embodiment, the region in the package at which the first chip 70 can be mounted is increased by mounting the second chip 80 on the first chip 70. The chip size of the first chip 70 can be increased thereby, and the on-resistance can be reduced.

The second electrode pad (the source pad) 74 of the first chip 70 and the third electrode pad (the source pad) 86 of the second chip 80 are connected by the electrically conductive bump 51 without using a wire. The parasitic inductance of the connection portion of the source electrodes of the first and second chips 70 and 80 can be reduced thereby, and the ringing of the power current loop can be reduced.

When bonding the third electrode pad 86 of the second chip 80 to the second electrode pad 74 of the first chip 70, the third surface 83 of the second chip 80 at which the third electrode pad 86 is located faces the first surface 71 of the first chip 70 at which the second electrode pad 74 is located. The second gate pad 87 also is located at the third surface 83 of the second chip 80. According to the second embodiment, the third gate pad 88 is located at the fourth surface 84 of the second chip 80 at the side opposite to the third surface 83; and the third gate pad 88 of the fourth surface 84 is connected to the second gate pad 87 of the third surface 83 by the connection member 89. Thereby, the gate electrode of the second chip 80 can be electrically connected to the external circuit by connecting the wire W to the third gate pad 88 that is located at the fourth surface 84 of the second chip 80 that does not face the first chip 70.

The second chip 80 that includes the p-channel MOSFET can have an ideal Kelvin connection in the cascode connection with the first chip 70. In other words, the connection portion (the second electrode pad 74 and the power supply terminal VDD) of the source electrodes of the first and second chips 70 and 80 functions as a driver source terminal connected to the return line of the gate current loop of the first chip 70 (illustrated by a white thick arrow in FIG. 8). Thereby, compared to a configuration in which an n-channel MOSFET has a cascode connection with the first chip 70, the gate current loop can be shorter, and the ringing can be reduced by the reduction of the parasitic inductance of the gate current loop.

As shown in FIG. 6, the power supply terminal VDD that is electrically connected to the second electrode pad 74 is positioned between the first gate terminal G1 that is electrically connected to the first gate pad 75 and the second gate terminal G2 that is electrically connected to the third gate pad 88 in the first direction d1 parallel to the first surface 71. Thereby, as shown in FIG. 8, the wiring 63 and the wiring 64 that form the gate current loop can be proximate and parallel along a direction crossing the first direction d1; the noise of the gate signal can be reduced.

Third Embodiment

A semiconductor device 3 of a third embodiment will now be described with reference to FIGS. 9 to 14B.

The semiconductor device 3 includes a wiring substrate 100, a first electrically conductive member 141, a second electrically conductive member 142, a third electrically conductive member 143, a first chip 111A, a second chip 111B, a third chip 112A, and a fourth chip 112B.

Figure 9:
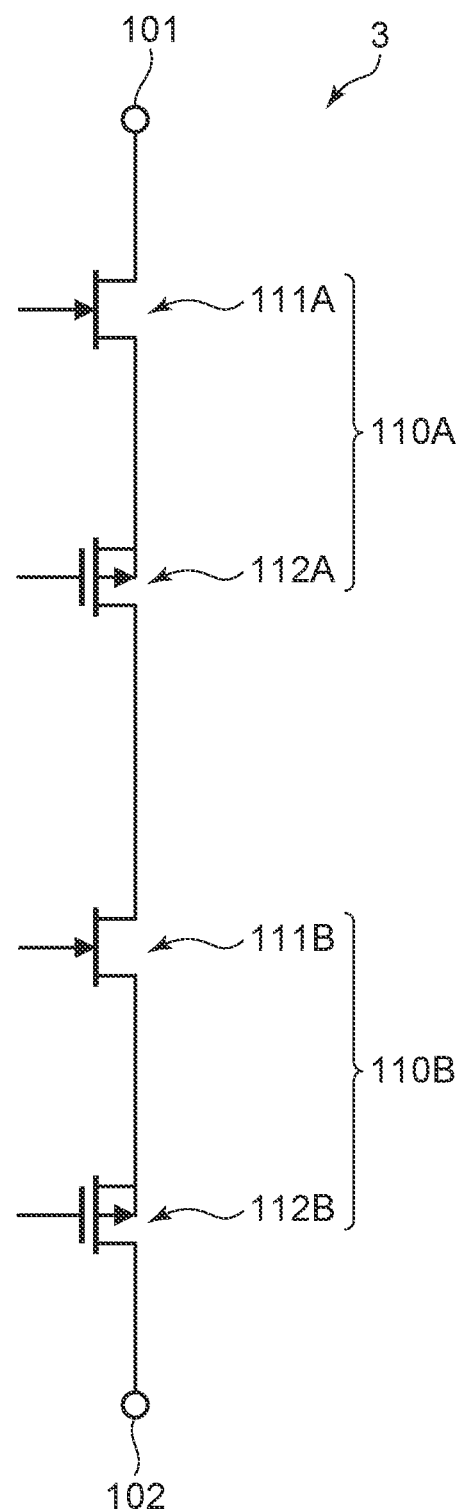
FIG. 9 is an equivalent circuit diagram of a semiconductor device of a third embodiment.

As shown in FIG. 9, a high-side device 110A and a low-side device 110B are connected in series between a first terminal 101 and a second terminal 102. The high-side device 110A includes the first chip 111A and the third chip 112A that have a cascode connection. The low-side device 110B includes the second chip 111B and the fourth chip 112B that have a cascode connection.

The first electrically conductive member 141, the second electrically conductive member 142, and the third electrically conductive member 143 are metal members and include, for example, copper. The first electrically conductive member 141, the second electrically conductive member 142, and the third electrically conductive member 143 are located on the wiring substrate 100 and are connected to an external circuit via wiring layers formed in the wiring substrate 100.

Figure 10:
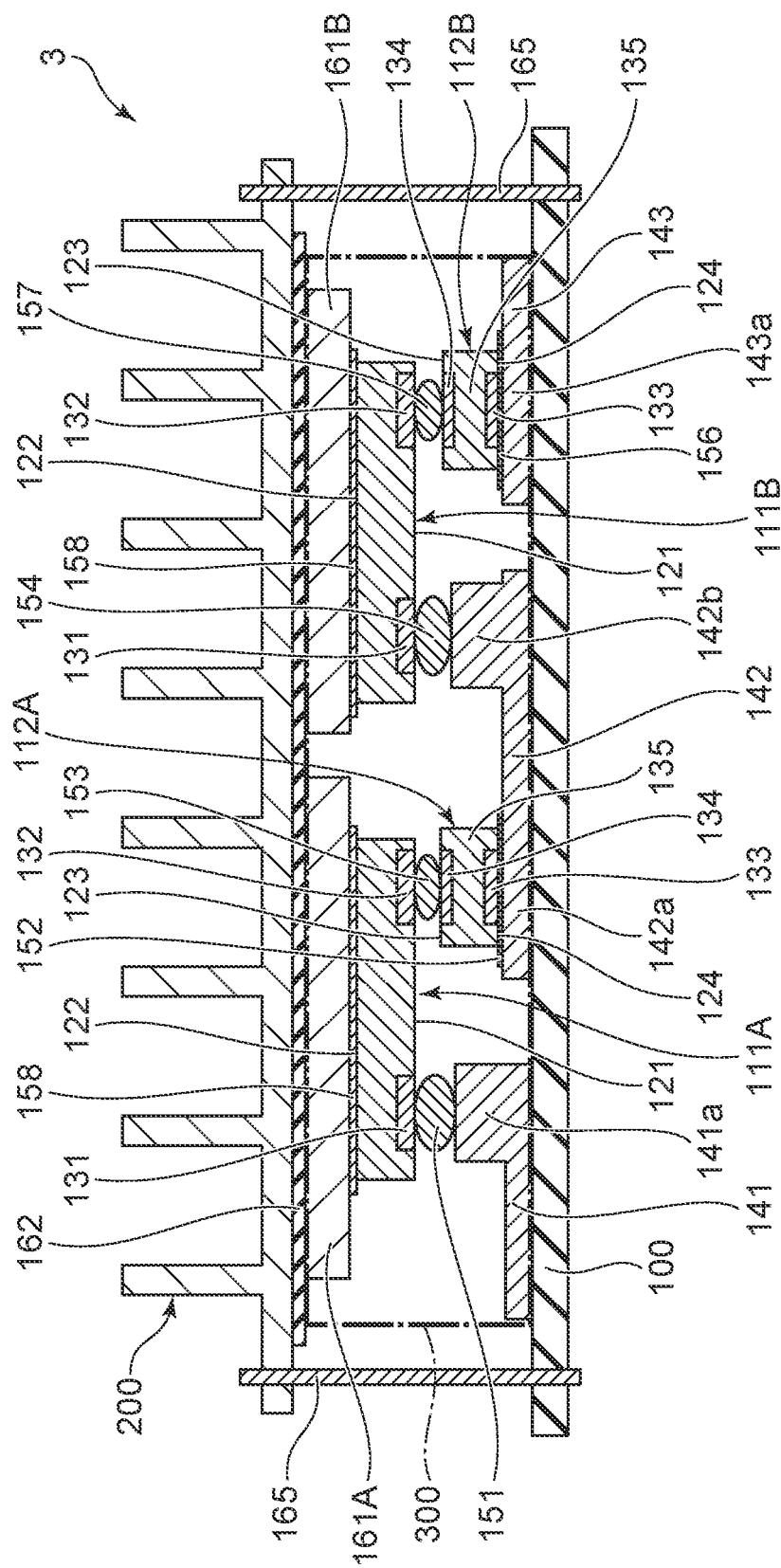
FIG. 10 is a schematic cross-sectional view of the semiconductor device of the third embodiment.

As shown in FIG. 10, the first electrically conductive member 141 includes a first bonding portion 141a. The second electrically conductive member 142 includes a second bonding portion 142a and a third bonding portion 142b. The third electrically conductive member 143 includes a fourth bonding portion 143a. The height to the upper surface of the first bonding portion 141a and the height to the upper surface of the third bonding portion 142b are greater than the height to the upper surface of the second bonding portion 142a and the height to the upper surface of the fourth bonding portion 143a. In the specification, "height" refers to the height from the upper surface of the wiring substrate 100. For example, the first bonding portion 141a and the third bonding portion 142b may have configurations that include silicon chips.

The first chip 111A and the second chip 111B each include, for example, a normally-on HEMT that is on when no input signal is applied to the gate. Similarly to the first chip 10 of the first embodiment, the first chip 111A and the second chip 111B each can include the element part 30 shown in FIG. 5. In other words, the first chip 111A and the second chip 111B each include the first semiconductor layer 40 that includes the n-type nitride semiconductor layer 42.

Figure 12:
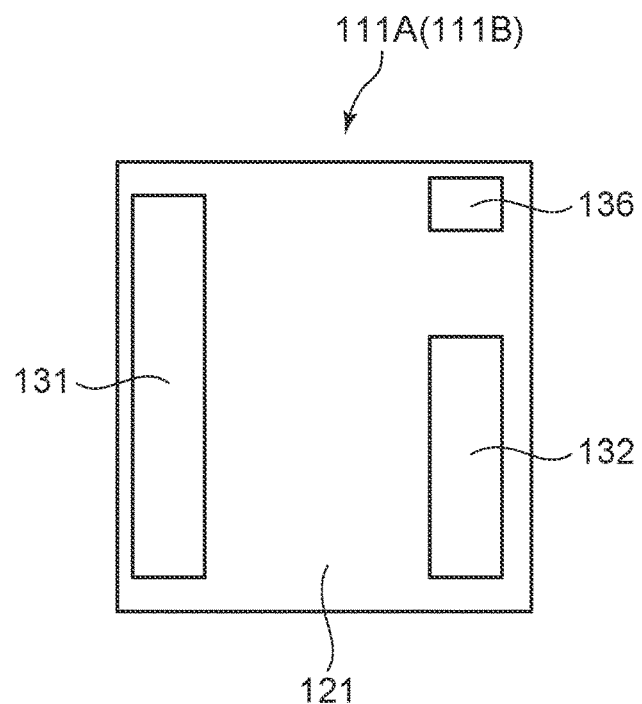
FIG. 12 is a schematic plan view of the first surface of the first chip (the second chip) of the third embodiment.

The first chip 111A and the second chip 111B each include a first surface 121 facing the upper surface of the wiring substrate 100, a second surface 122 at the side opposite to the first surface 121, a first electrode pad 131 located at the first surface 121, and a second electrode pad 132 located at the first surface 121. Also, the first chip 111A and the second chip 111B each include a first gate pad 136 located at the first surface 121 as shown in FIG. 12.

The second surface 122 is, for example, the back surface of the substrate 31 of the element part 30 shown in FIG. 5. An insulating film that covers the drain electrode 32, the source electrode 33, and the gate electrode 34 is located on the second nitride semiconductor layer 42 of the element part 30; and the first electrode pad 131, the second electrode pad 132, and the first gate pad 136 are located on the insulating film.

The first electrode pad 131 is a drain pad that is electrically connected to the drain electrode 32. The second electrode pad 132 is a source pad that is electrically connected to the source electrode 33. The first gate pad 136 is electrically connected to the gate electrode 34.

The third chip 112A and the fourth chip 112B each are normally-off, i.e., off when no input signal is applied to the gate, and include, for example, a p-channel MOSFET. The third chip 112A and the fourth chip 112B each include a third surface 123, a fourth surface 124 at the side opposite to the third surface 123, a second semiconductor layer 135 that includes a p-type channel, a third electrode pad 133 located at the fourth surface 124, and a fourth electrode pad 134 located at the third surface 123.

The third chip 112A is located on the second bonding portion 142a of the second electrically conductive member 142. The fourth chip 112B is located on the fourth bonding portion 143a of the third electrically conductive member 143. The third surface 123 of the third chip 112A faces the first surface 121 of the first chip 111A. The third surface 123 of the fourth chip 112B faces the first surface 121 of the second chip 111B.

The second semiconductor layer 135 is, for example, a silicon layer and includes a p-type channel. The third chip 112A and the fourth chip 112B each are vertical devices in which a current flows in the thickness direction of the second semiconductor layer 135 (the vertical direction connecting the third electrode pad 133 and the fourth electrode pad 134). The third electrode pad 133 functions as the drain electrode of the MOSFET. The fourth electrode pad 134 functions as the source electrode of the MOSFET.

Figure 11:
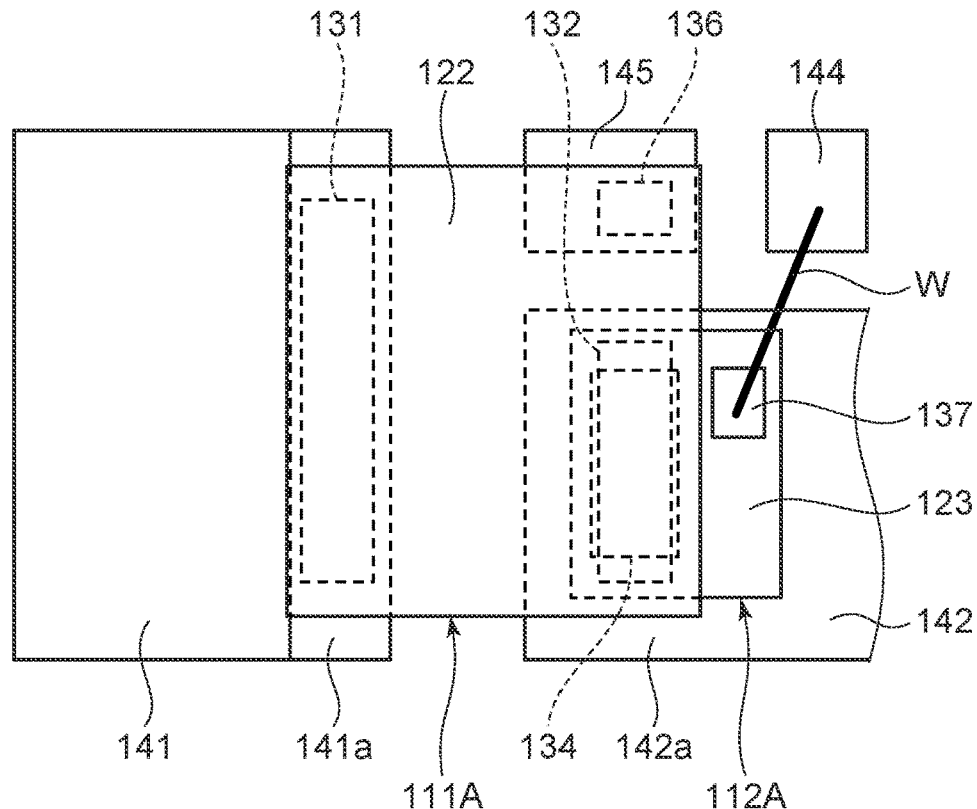
FIG. 11 is a schematic plan view of the semiconductor device of the third embodiment.

As shown in FIG. 11, the third chip 112A and the fourth chip 112B each include a second gate pad 137 located at the third surface 123. The second gate pad 137 is electrically connected to the gate electrode of the MOSFET.

As shown in FIG. 10, the first electrode pad 131 of the first chip 111A faces the upper surface of the first bonding portion 141a of the first electrically conductive member 141. The first electrode pad 131 of the first chip 111A is bonded to the upper surface of the first bonding portion 141a of the first electrically conductive member 141 by an electrically conductive bonding material 151 such as, for example, solder, etc., and is electrically connected to the first electrically conductive member 141.

The third electrode pad 133 of the third chip 112A is bonded to the second bonding portion 142a of the second electrically conductive member 142 by an electrically conductive bonding material 152 such as, for example, solder, silver paste, etc., and is electrically connected to the second electrically conductive member 142.

The second electrode pad 132 of the first chip 111A faces the fourth electrode pad 134 of the third chip 112A and is bonded to the fourth electrode pad 134 of the third chip 112A by an electrically conductive bonding material 153 such as, for example, solder, etc. In other words, the source electrodes of the first and third chips 111A and 112A are electrically connected to each other.

The first electrode pad 131 of the second chip 111B faces the upper surface of the third bonding portion 142b of the second electrically conductive member 142. The first electrode pad 131 of the second chip 111B is bonded to the upper surface of the third bonding portion 142b of the second electrically conductive member 142 by an electrically conductive bonding material 154 such as, for example, solder, etc., and is electrically connected to the second electrically conductive member 142. The third electrode pad 133 of the third chip 112A and the first electrode pad 131 of the second chip 111B are electrically connected to each other via the second electrically conductive member 142.

The third electrode pad 133 of the fourth chip 112B is bonded to the fourth bonding portion 143a of the third electrically conductive member 143 by an electrically conductive bonding material 156 such as, for example, solder, silver paste, etc., and is electrically connected to the third electrically conductive member 143.

The second electrode pad 132 of the second chip 111B faces the fourth electrode pad 134 of the fourth chip 112B and is bonded to the fourth electrode pad 134 of the fourth chip 112B by an electrically conductive bonding material 157 such as, for example, solder, etc. In other words, the source electrodes of the second and fourth chips 111B and 112B are electrically connected to each other.

As shown in FIG. 11, the semiconductor device 3 further includes a fourth electrically conductive member 144 and a fifth electrically conductive member 145. The fourth electrically conductive member 144 and the fifth electrically conductive member 145 are metal members and include, for example, copper. The fourth electrically conductive member 144 and the fifth electrically conductive member 145 are located on the wiring substrate 100 and are connected to an external circuit via wiring layers formed in the wiring substrate 100.

Two fourth electrically conductive members 144 are located on the wiring substrate 100 to correspond to the second gate pad 137 of the third chip 112A and the second gate pad 137 of the fourth chip 112B. Two fifth electrically conductive members 145 are located on the wiring substrate 100 to correspond to the first gate pad 136 of the first chip 111A and the first gate pad 136 of the second chip 111B.

The first chip 111A is not overlaid on the second gate pad 137 of the third chip 112A. The second chip 111B is not overlaid on the second gate pad 137 of the fourth chip 112B. The second gate pads 137 of the third and fourth chips 112A and 112B are electrically connected to the fourth electrically conductive members 144 by wires W.

The first gate pads 136 of the first and second chips 111A and 111B face the upper surfaces of the fifth electrically conductive members 145. The first gate pads 136 of the first and second chips 111A and 111B are bonded to the upper surfaces of the fifth electrically conductive members 145 by electrically conductive bonding materials such as, for example, solder, etc., and are electrically connected to the fifth electrically conductive members 145.

As shown in FIG. 10, the semiconductor device 3 further includes metal members 161A and 161B, an insulating sheet 162, and a heat dissipation member 200. The metal members 161A and 161B, the insulating sheet 162, and the heat dissipation member 200 are located on the second surface 122 of the first chip 111A and on the second surface 122 of the second chip 111B.

The metal members 161A and 161B include, for example, copper. The second surfaces 122 of the first and second chips 111A and 111B are bonded to the metal members 161A and 161B by bonding materials 158 such as, for example, solder, silver paste, etc., that have excellent thermal conductivity. The metal member 161A that is located on the second surface 122 of the first chip 111A and the metal member 161B that is located on the second surface 122 of the second chip 111B are separated from each other.

The heat dissipation member 200 is located on the metal members 161A and 161B with the insulating sheet 162 that has excellent thermal conductivity interposed. The heat dissipation member 200 is, for example, a metal member that includes multiple fins. For example, the heat dissipation member 200 and the wiring substrate 100 are fixed to each other by multiple pins 165. The metal members 161A and 161B, the insulating sheet 162, and the heat dissipation member 200 are closely adhered to each other.

The semiconductor device 3 further includes a resin member 300 (shown by a single dot-dash line in FIG. 10)

located between the wiring substrate 100 and the insulating sheet 162. The resin member 300 covers the first electrically conductive member 141, the second electrically conductive member 142, the third electrically conductive member 143, the fourth electrically conductive member 144, the fifth electrically conductive member 145, the first chip 111A, the second chip 111B, the third chip 112A, the fourth chip 112B, and the metal members 161A and 161B.

According to the semiconductor device 3 of the third embodiment, the high-side device 110A and the low-side device 110B are packaged in one package; and the high-side device 110A and the low-side device 110B are electrically connected by the second electrically conductive member 142 in the package. The parasitic inductances and the resistances of the electrical connection portions between the high-side device 110A and the low-side device 110B can be reduced thereby.

The second surfaces 122 of the first and second chips 111A and 111B are not bonded to the wiring substrate 100 and are oriented upward from the wiring substrate 100. Therefore, the metal members 161A and 161B and/or the heat dissipation member 200 can be located at the second surface 122. The heat dissipation of the first and second chips 111A and 111B can be increased thereby, and in particular, an efficiency reduction during high output can be suppressed.

An example of a method for manufacturing the semiconductor device 3 of the third embodiment will now be described.

Figure 13A:
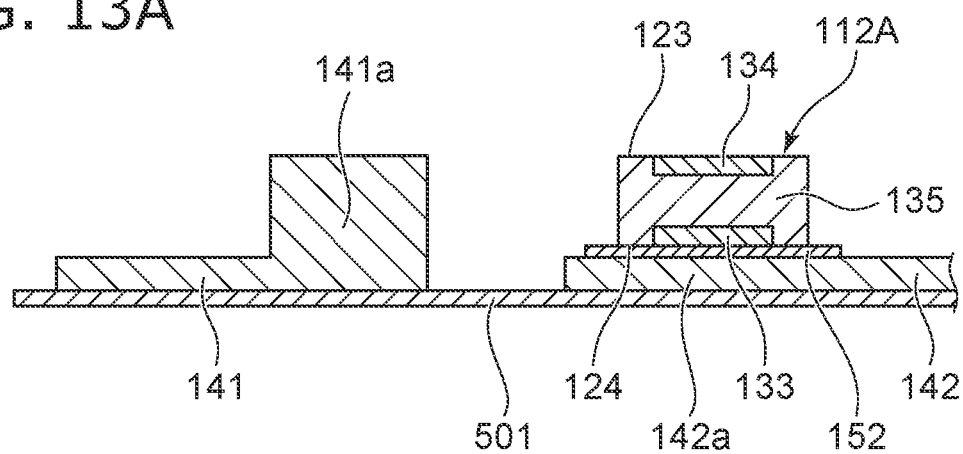
FIGS. 13A to 14B are schematic cross-sectional views showing a method for manufacturing the semiconductor device of the third embodiment.

As shown in FIG. 13A, the first electrically conductive member 141 and the second electrically conductive member 142 are mounted on a tape 501. The third electrically conductive member 143 also is mounted on the tape 501. The third chip 112A is mounted on the second bonding portion 142a of the second electrically conductive member 142 via the electrically conductive bonding material 152 such as, for example, solder, silver paste, etc. The third electrode pad 133 of the third chip 112A is bonded to the upper surface of the second bonding portion 142a of the second electrically conductive member 142 via the bonding material 152. The fourth chip 112B is mounted on the fourth bonding portion 143a of the third electrically conductive member 143 via the electrically conductive bonding material 156 such as, for example, solder, silver paste, etc. The third electrode pad 133 of the fourth chip 112B is bonded to the upper surface of the fourth bonding portion 143a of the third electrically conductive member 143 via the bonding material 156.

Figure 13B:
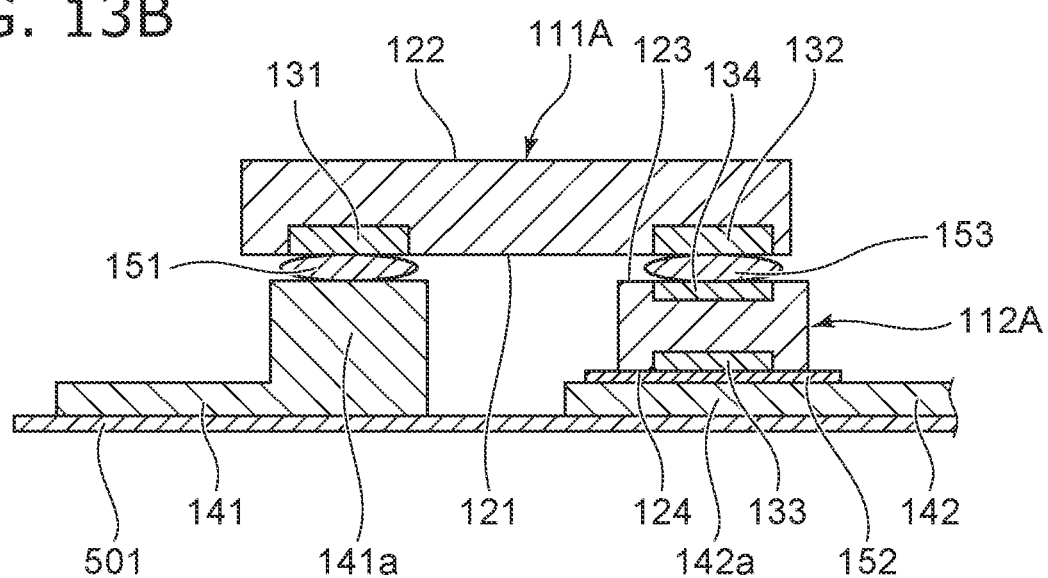

Then, as shown in FIG. 13B, the first chip 111A is mounted on the first electrically conductive member 141 and on the second electrically conductive member 142. The first electrode pad 131 of the first chip 111A is bonded to the upper surface of the first bonding portion 141a of the first electrically conductive member 141 by the electrically conductive bonding material 151 such as, for example, solder, etc. The second electrode pad 132 of the first chip 111A is bonded to the fourth electrode pad 134 of the third chip 112A by the electrically conductive bonding material 153 such as, for example, solder, etc. Similarly to the first chip 111A, the first electrode pad 131 of the second chip 111B is bonded to the upper surface of the third bonding portion 142b of the second electrically conductive member 142 by the electrically conductive bonding material 154 such as, for example, solder, etc. The second electrode pad 132 of the second chip 111B is bonded to the fourth electrode pad 134 of the fourth chip 112B by the electrically conductive bonding material 157 such as, for example, solder, etc.

Subsequently, the metal member 161A is bonded on the second surface 122 of the first chip 111A; and the metal member 161B is bonded on the second surface 122 of the second chip 111B. Subsequently, the first electrically conductive member 141, the second electrically conductive member 142, the third electrically conductive member 143, the first chip 111A, the second chip 111B, the third chip 112A, the fourth chip 112B, the metal members 161A and 161B, etc., are sealed with the resin member 300. After being formed to cover the upper surfaces of the metal members 161A and 161B, the resin member 300 is polished, and the upper surfaces of the metal members 161A and 161B are exposed. The packaged semiconductor device can be mounted on the wiring substrate 100 by peeling the tape 501. The heat dissipation member 200 is located on the upper surfaces of the metal members 161A and 161B with the insulating sheet 162 interposed as necessary.

Figure 14A:
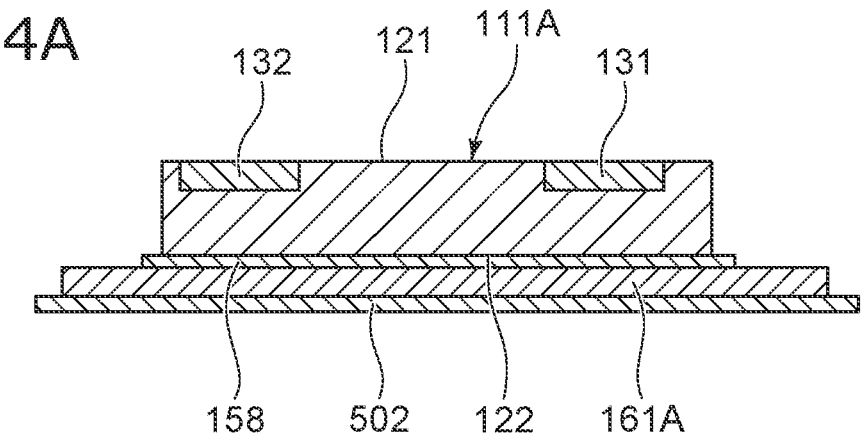
Figure 14B:
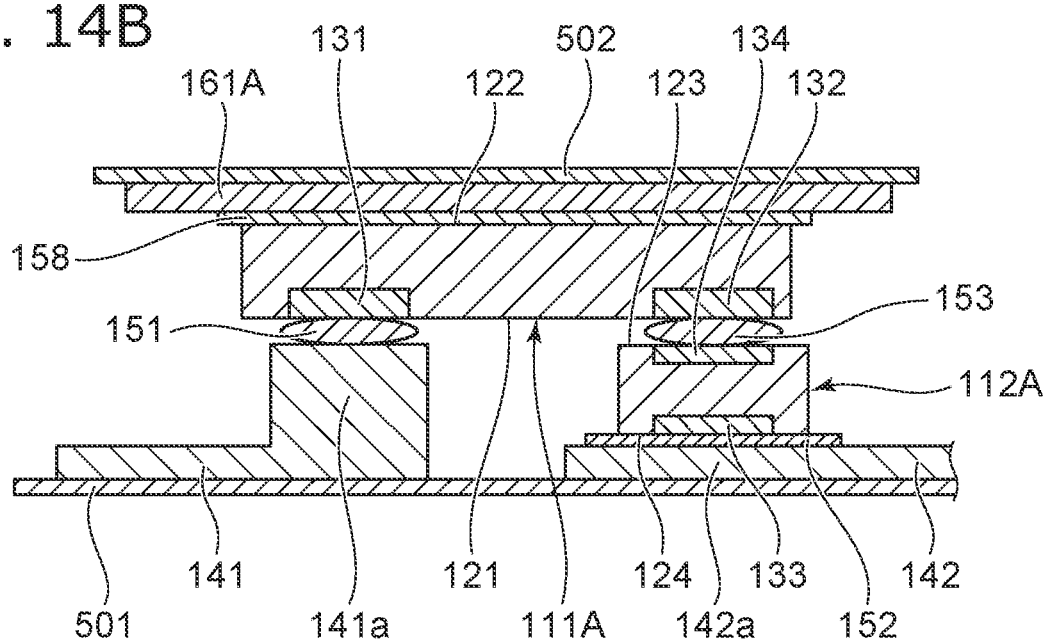

FIGS. 14A and 14B show another example of the method for manufacturing the semiconductor device 3 of the third embodiment.

As shown in FIG. 14A, the metal member 161A is mounted on a tape 502. The first chip 111A is mounted on the metal member 161A. The second surface 122 of the first chip 111A is bonded to the metal member 161A by the bonding material 158 such as, for example, solder, silver paste, etc. Similarly, the metal member 161B is mounted on the tape 502. The second chip 111B is mounted on the metal member 161B. The second surface 122 of the second chip 111B is bonded to the metal member 161B by the bonding material 158 such as, for example, solder, silver paste, etc.

On the other hand, as shown in FIG. 14B, the first electrically conductive member 141 and the second electrically conductive member 142 are mounted on the tape 501. The third electrically conductive member 143 also is mounted on the tape 501. The third chip 112A is mounted on the second bonding portion 142a of the second electrically conductive member 142 via the bonding material 152. The third electrode pad 133 of the third chip 112A is bonded to the upper surface of the second bonding portion 142a of the second electrically conductive member 142 via the bonding material 152. The fourth chip 112B is mounted on the fourth bonding portion 143a of the third electrically conductive member 143 via the bonding material 156. The third electrode pad 133 of the fourth chip 112B is bonded to the upper surface of the fourth bonding portion 143a of the third electrically conductive member 143 via the bonding material 156.

The first chip 111A and the second chip 111B that are supported by the tape 502 are mounted on the first electrically conductive member 141, the second electrically conductive member 142, and the third electrically conductive member 143 that are supported by the tape 501. The first chip 111A is mounted on the first electrically conductive member 141 and on the second electrically conductive member 142. The first electrode pad 131 of the first chip 111A is bonded to the upper surface of the first bonding portion 141a of the first electrically conductive member 141 by the bonding material 151. The second electrode pad 132 of the first chip 111A is bonded to the fourth electrode pad 134 of the third chip 112A by the bonding material 153. Similarly to the first chip 111A, the first electrode pad 131 of the second chip 111B is bonded to the upper surface of the third bonding portion 142b of the second electrically conductive member 142 by the bonding material 154. The second electrode pad 132 of the second chip 111B is bonded to the fourth electrode pad 134 of the fourth chip 112B by the bonding material 157.

After the tape 502 is peeled, the metal member 161A is bonded on the second surface 122 of the first chip 111A, and the metal member 161B is bonded on the second surface 122 of the second chip 111B. Subsequently, the first electrically conductive member 141, the second electrically conductive member 142, the third electrically conductive member 143, the first chip 111A, the second chip 111B, the third chip 112A, the fourth chip 112B, the metal members 161A and 161B, etc., are sealed with the resin member 300. After being formed to cover the upper surfaces of the metal members 161A and 161B, the resin member 300 is polished, and the upper surfaces of the metal members 161A and 161B are exposed. The packaged semiconductor device can be mounted on the wiring substrate 100 by peeling the tape 501. The heat dissipation member 200 is located on the upper surfaces of the metal members 161A and 161B with the insulating sheet 162 interposed as necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a first chip of a first type, the first chip including
      a first surface,
      a second surface at a side opposite to the first surface,
      a first semiconductor layer including a nitride semiconductor layer of a first conductivity type,
      a first electrode pad located at the first surface,
      a second electrode pad located at the first surface,
      a first gate pad located at the first surface, and
      a third electrode pad located at the first surface; and
   a second chip located on the first surface of the first chip, the second chip being of a second type that is different from the first type, the second chip including
      a third surface facing the first surface of the first chip,
      a fourth surface at a side opposite to the third surface,
      a second semiconductor layer including a channel of a second conductivity type,
      a fourth electrode pad located at the fourth surface,
      a fifth electrode pad located at the third surface and bonded to the second electrode pad of the first chip, and
      a second gate pad located at the third surface and bonded to the third electrode pad of the first chip.

2. The device according to claim 1, further comprising:
   a first gate terminal electrically connected to the first gate pad;
   a power supply terminal electrically connected to the second electrode pad; and
   a second gate terminal electrically connected to the third electrode pad,
   the second electrode pad being positioned between the first gate pad and the third electrode pad in a first direction parallel to the first surface,
   the power supply terminal being positioned between the first gate terminal and the second gate terminal in the first direction.

3. The device according to claim 1, wherein
   the first chip includes a HEMT (High Electron Mobility Transistor), and
   the second chip includes a p-channel MOSFET (Metal-Oxide-Semiconductor Field Effect Transistor).

4. A semiconductor device, comprising:
   a first chip of a first type, the first chip including
      a first surface,
      a second surface at a side opposite to the first surface,
      a first semiconductor layer including a nitride semiconductor layer of a first conductivity type,
      a first electrode pad located at the first surface,
      a second electrode pad located at the first surface, and
      a first gate pad located at the first surface; and
   a second chip located on the first surface of the first chip, the second chip being of a second type that is different from the first type, the second chip including
      a third surface facing the first surface of the first chip,
      a fourth surface at a side opposite to the third surface,
      a second semiconductor layer including a channel of a second conductivity type,
      a third electrode pad located at the third surface and bonded to the second electrode pad of the first chip,
      a second gate pad located at the third surface,
      a fourth electrode pad located at the fourth surface,
      a third gate pad located at the fourth surface, and
      a connection member extending between the third surface and the fourth surface and electrically connecting the second gate pad and the third gate pad.

5. The device according to claim 4, further comprising:
   a first gate terminal electrically connected to the first gate pad;
   a power supply terminal electrically connected to the second electrode pad; and
   a second gate terminal electrically connected to the third gate pad,
   the power supply terminal being positioned between the first gate terminal and the second gate terminal in a first direction parallel to the first surface.

6. The device according to claim 4, wherein
   the first chip includes a HEMT (High Electron Mobility Transistor), and
   the second chip includes a p-channel MOSFET (Metal-Oxide-Semiconductor Field Effect Transistor).

7. A semiconductor device, comprising:
   a first electrically conductive member including a first bonding portion;
   a second electrically conductive member including a second bonding portion and a third bonding portion;
   a third electrically conductive member including a fourth bonding portion;
   a first chip of a first type;
   a second chip of the first type;
   a third chip located on the second bonding portion of the second electrically conductive member, the third chip being of a second type that is different from the first type; and
   a fourth chip located on the fourth bonding portion of the third electrically conductive member, the fourth chip being of the second type,
   the first chip and the second chip each including
      a first surface,
      a second surface at a side opposite to the first surface,
      a first semiconductor layer including a nitride semiconductor layer of a first conductivity type,
      a first electrode pad located at the first surface, and a second electrode pad located at the first surface, the third chip and the fourth chip each including
a third surface facing the first surface,
a fourth surface at a side opposite to the third surface,
a second semiconductor layer including a channel of a second conductivity type,
a third electrode pad located at the fourth surface, and
a fourth electrode pad located at the third surface,
the first electrode pad of the first chip being bonded to the first bonding portion of the first electrically conductive member,
the third electrode pad of the third chip being bonded to the second bonding portion of the second electrically conductive member,
the second electrode pad of the first chip being bonded to the fourth electrode pad of the third chip,
the first electrode pad of the second chip being bonded to the third bonding portion of the second electrically conductive member,
the third electrode pad of the fourth chip being bonded to the fourth bonding portion of the third electrically conductive member,
the second electrode pad of the second chip being bonded to the fourth electrode pad of the fourth chip.

8. The device according to claim 7, further comprising:
a heat dissipation member located on the second surface of the first chip and on the second surface of the second chip.

9. The device according to claim 7, further comprising:
a fourth electrically conductive member,
the third chip and the fourth chip each further including a gate pad located at the third surface,
the gate pad being electrically connected to the fourth electrically conductive member by a wire.

10. The device according to claim 7, wherein
the first chip and the second chip include a HEMT (High Electron Mobility Transistor), and
the third chip and the fourth chip include a p-channel MOSFET (Metal-Oxide-Semiconductor Field Effect Transistor).

* * * * *